US011955164B2

(12) United States Patent
Tu

(10) Patent No.: US 11,955,164 B2
(45) Date of Patent: Apr. 9, 2024

(54) METHOD FOR ACCESSING MEMORY AND MEMORY DEVICE USING THE SAME

(71) Applicant: Winbond Electronics Corp., Taichung (TW)

(72) Inventor: Ying-Te Tu, Taichung (TW)

(73) Assignee: Winbond Electronics Corp., Taichung (TW)

( * ) Notice: Subject to any disclaimer, the term of this patent is extended or adjusted under 35 U.S.C. 154(b) by 212 days.

(21) Appl. No.: 17/740,310

(22) Filed: May 9, 2022

(65) Prior Publication Data

US 2023/0360692 A1   Nov. 9, 2023

(51) Int. Cl.
| | | |
|---|---|---|
| G11C 7/00 | (2006.01) | |
| G11C 11/4091 | (2006.01) | |
| G11C 11/419 | (2006.01) | |
| H01L 23/00 | (2006.01) | |
| H01L 25/065 | (2023.01) | |
| H01L 25/18 | (2023.01) | |

(52) U.S. Cl.
CPC ........ G11C 11/4091 (2013.01); G11C 11/419 (2013.01); H01L 24/08 (2013.01); H01L 25/0657 (2013.01); H01L 25/18 (2013.01); H01L 2224/08145 (2013.01); H01L 2225/06541 (2013.01); H01L 2924/1431 (2013.01); H01L 2924/1436 (2013.01); H01L 2924/1437 (2013.01)

(58) Field of Classification Search
CPC ... G11C 11/4091; G11C 11/419; H01L 24/08; H01L 25/0657

USPC .......................................................... 365/205
See application file for complete search history.

(56) References Cited

U.S. PATENT DOCUMENTS

| | | | |
|---|---|---|---|
| 2020/0133505 A1* | 4/2020 | Kim | G11C 29/028 |
| 2022/0130816 A1* | 4/2022 | Mathur | H01L 25/50 |
| 2023/0075351 A1* | 3/2023 | Tang | G11C 11/4093 |
| 2023/0386563 A1* | 11/2023 | So | G11C 29/023 |

FOREIGN PATENT DOCUMENTS

TW       583668       4/2004

OTHER PUBLICATIONS

"Office Action of Taiwan Counterpart Application", dated Aug. 22, 2023, p. 1-p. 6.

* cited by examiner

*Primary Examiner* — Vu A Le
(74) *Attorney, Agent, or Firm* — JCIPRNET

(57) ABSTRACT

A method for accessing memory and a memory device using the same method are provided. The method includes: coupling, by a first sense amplifier (SA) of a memory, to a memory cell of the memory to receive data from the memory cell; coupling a first terminal of a transistor of the memory to the first SA; coupling a first command terminal of a system on chip (SoC) to a second terminal of the transistor, and coupling a first input/output (I/O) terminal of the SoC to a third terminal of the transistor; and issuing, by the SoC, an access command to the second terminal of the transistor to access the data output by the first SA through the third terminal of the transistor.

10 Claims, 4 Drawing Sheets

METHOD FOR ACCESSING MEMORY AND MEMORY DEVICE USING THE SAME

BACKGROUND

Technical Field

The present disclosure relates to a method for accessing a memory and a memory device using the same.

Description of Related Art

The conventional method for accessing a DRAM requires a controller to issue row and column commands. The controller issues a row command along with a bank address to select a word line in a bank. After the word line is selected, the data in the memory cell controlled by the word line is transferred to the first sense amplifier of the memory. The controller then selects a column select line by issuing a line command. The enabled column select lines transfer data from a small number of first sense amplifiers to second sense amplifiers. Lastly, the controller transmits the second sense amplifier to the external device by command.

As the space for placing the column select line and the data line on the two-dimensional plane is limited, the column select line cannot transmit data to many first sense amplifiers at the same time. In addition, cell arrays in dynamic random-access memory are disposed densely. When the density of the DRAM increases, the number of cell blocks of the DRAM increases, and the total length of the path of the column select line also needs to increase. Furthermore, as the density increases, the total length of the path for transferring the data in the first sense amplifier to the main data line MDQ of the second sense amplifier also needs to increase. When the lengths of the column select line and the main data line MDQ are exceedingly long, the line widths of the column select line and the main data line MDQ cannot be reduced greatly. In other words, the line widths of the column select lines and the main data line MDQ limit the number of the first sense amplifiers that may be accessed at one time.

SUMMARY

The disclosure provides a method for accessing a memory and a memory device using the method, which are capable of improving the read/write bandwidth of the memory based on the three-dimensional chip stacking technology.

A memory device of the disclosure includes a memory and a system on chip (SoC). The memory includes a memory cell, a first sense amplifier, and a transistor. The first sense amplifier is coupled to the memory cell and receives data from the memory cell. The first terminal of the transistor is coupled to the first sense amplifier. The SoC includes a first command terminal and a first input/output terminal. The first command terminal is coupled to the second terminal of the transistor, and the first input/output terminal is coupled to the third terminal of the transistor. The SoC issues an access command to the second terminal of the transistor to access the data output by the first sense amplifier through the third terminal of the transistor.

In an embodiment of the disclosure, the above-mentioned first command terminal is coupled to a plurality of second terminals respectively corresponding to a plurality of transistors, and the transistors include the transistor, and the second terminals include the second terminal.

A method for accessing a memory of the disclosure is applicable to an SoC and a memory. The method includes: coupling, by a first sense amplifier of the memory, to a memory cell of the memory to receive data from the memory cell; coupling the first terminal of a transistor of the memory to the first sense amplifier; coupling the first command terminal of the SoC to the second terminal of the transistor, and coupling the first input/output terminal of the SoC to the third terminal of the transistor; and issuing, by the system on chip, an access command to the second terminal of the transistor to access the data output by the first sense amplifier through the third terminal of the transistor.

Based on the above, the disclosure uses the three-dimensional chip stacking technology to increase the access speed of the memory, so that the access speed reaches or exceeds 16K bits. For SoCs that stresses more on memory access speed and bandwidth, the performance of SoCs employing the disclosure shall improve significantly.

DESCRIPTION OF THE EMBODIMENTS

Figure 1:
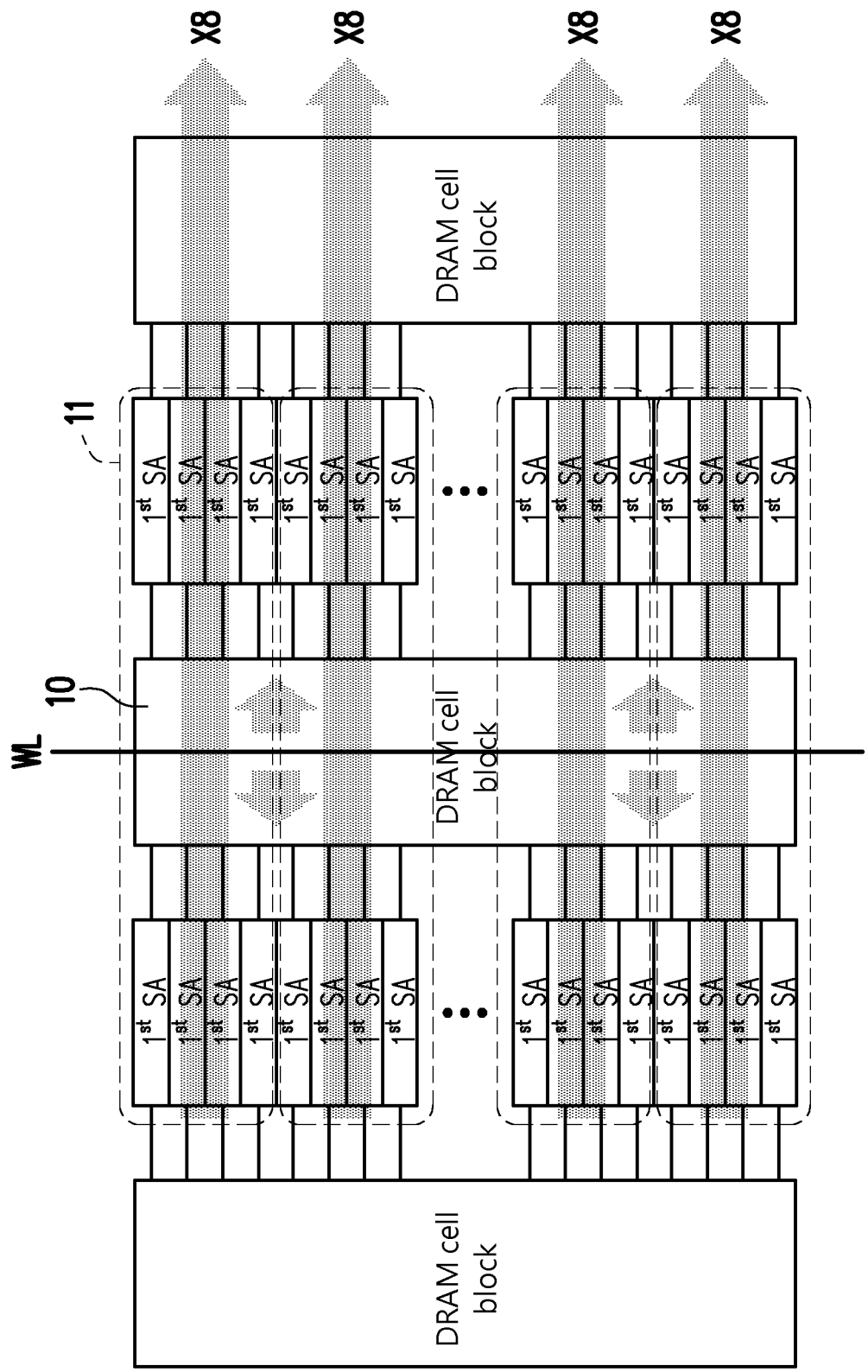
FIG. 1 is a schematic diagram of a conventional DRAM architecture.

FIG. 1 is a schematic diagram of a conventional DRAM architecture. The DRAM cell block 10 may include a plurality of memory cells. After the controller selects the word line WL corresponding to the DRAM cell block 10 through a row command, the word line WL enables the DRAM cell block 10 to transmit data of a plurality of memory cells respectively to a plurality of first sense amplifiers. Take the existing memory process as an example. In FIG. 1, a plurality of memory cells enabled by the word line WL store 16K-bit data in total. The 8K-bit data is transmitted to a plurality of first sense amplifiers disposed on the left side of the DRAM cell block 10, while another 8K-bit data is transmitted to a plurality of first sense amplifiers disposed on the right side of the DRAM cell block 10.

After the controller selects the column select line corresponding to a block 11, the four first sense amplifiers located on the left side of block 11 output 4-bit data, and the four first sense amplifiers located on the right side of block 11 output 4-bit data. In other words, the controller accesses 8-bit data through a single column select line. Assuming that the layout of the memory is limited by the plane area so that the controller can only enable 16 column select lines at the same time, the controller only access 128-bit (8*16=128) data at a time accordingly. If the controller is required to access the 16K-bit data enabled by the WL, the controller needs to enable the column select line 128 times, which takes a significant amount of time.

Figure 2:
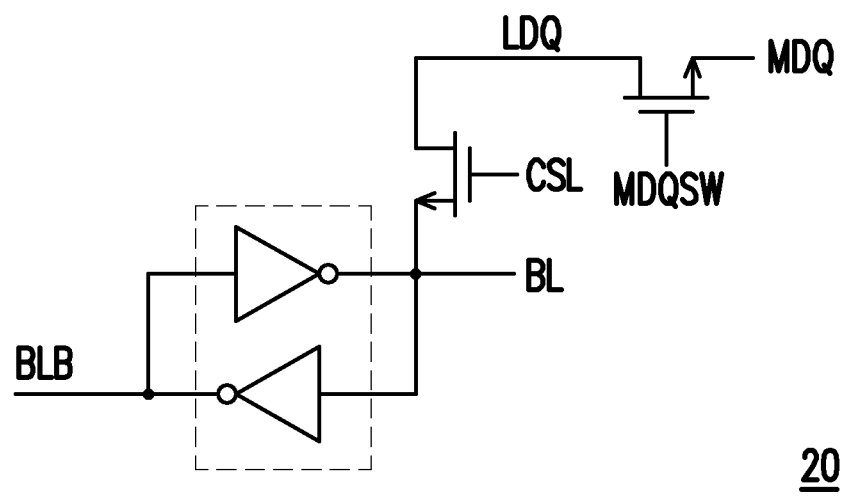
FIG. 2 is a schematic diagram illustrating a circuit of a conventional first sense amplifier.

FIG. 2 is a schematic diagram of a circuit 20 of a conventional the first sense amplifier. The circuit 20 mainly includes two inverters connected head-to-tail. As the column select line CSL and the main data line MDQ in the circuit 20 need to span the entire cell array of the memory, the lengths of the column select line CSL and the main data line MDQ are very long. Accordingly, the line widths of the column select line CSL and the main data line MDQ cannot be greatly reduced. Many two-dimensional plane spaces of the memory are occupied by the column select line CSL and the main data line MDQ, thereby limiting the number of memory cells that may be accessed by a single column select line CSL.

Figure 3:
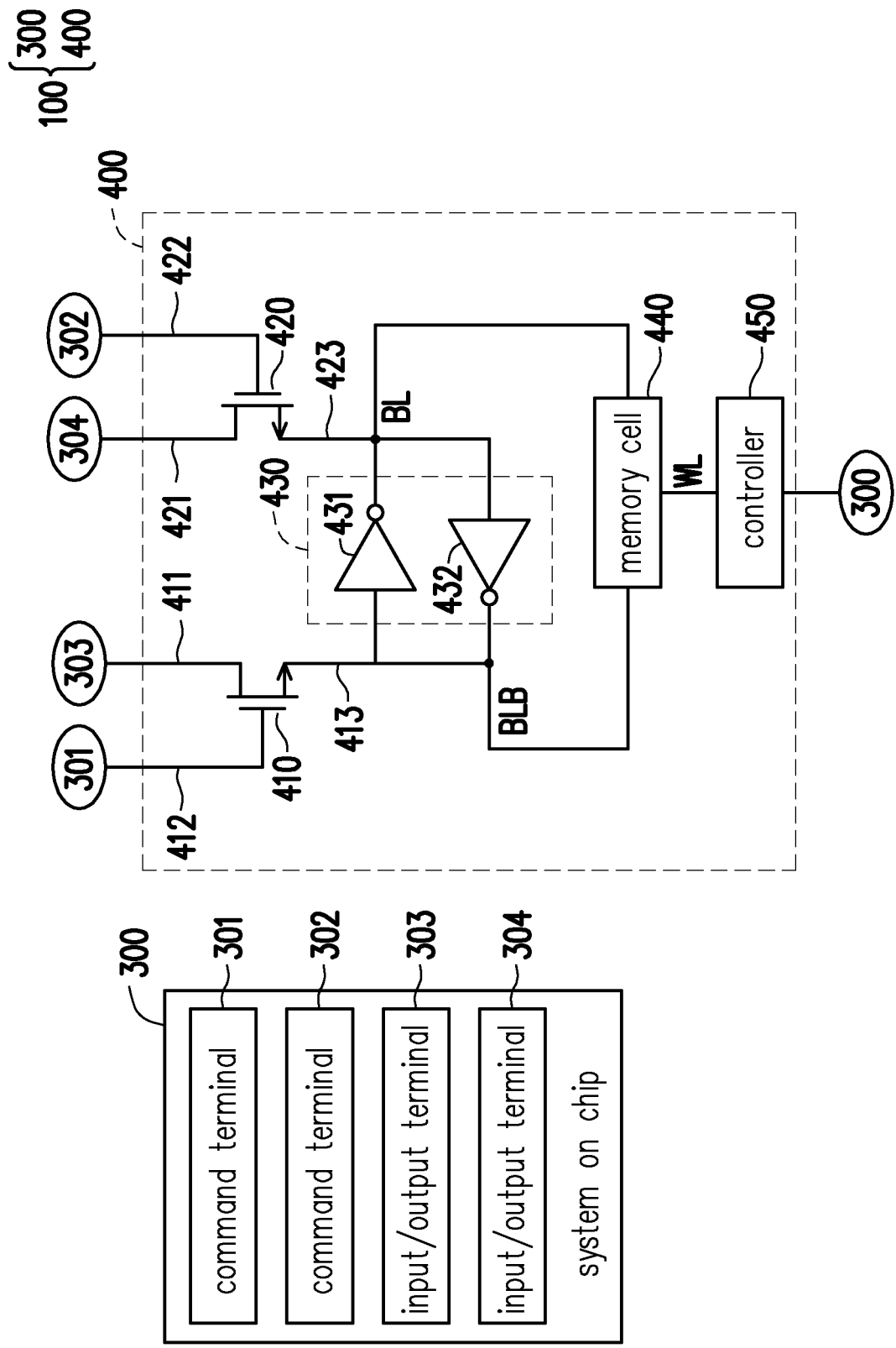
FIG. 3 is a schematic diagram of a memory device according to an embodiment of the disclosure.

To increase the access rate and bandwidth of the memory, the disclosure provides a memory device 100. FIG. 3 is a schematic diagram of the memory device 100 according to an embodiment of the disclosure. The memory device 100 may include a system on chip (SoC) 300 and a memory 400.

The SoC 300 is an electronic system implemented by an integrated circuit. The SoC 300 may include, but is not limited to, a command terminal 301, a command terminal 302, an input/output (I/O) terminal 303, and an I/O terminal 304. The SoC 300 controls the memory 400 through the command terminal 301 or the command terminal 302, and data may be written into or read from the memory 400 through the I/O terminal 303 or the I/O terminal 304.

The memory 400 may include, but is not limited to, a dynamic random-access memory (DRAM) or a static random-access memory (SRAM). The memory 400 may include, but is not limited to, a transistor 410, a transistor 420, a first sense amplifier 430, a memory cell 440, and a controller 450.

Figure 4:
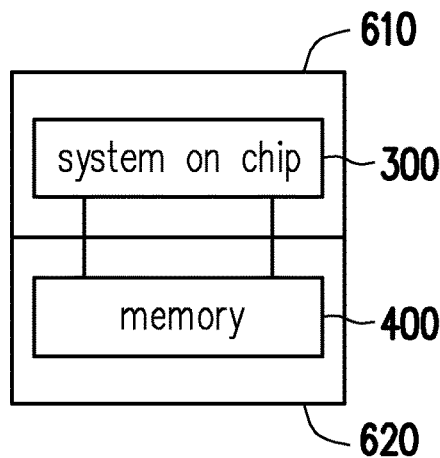
FIG. 4 is a schematic diagram of connecting a system on chip and a memory based on a hybrid bonding technology according to an embodiment of the disclosure.

In one embodiment, the SoC 300 and the memory 400 are respectively packaged in different dies. FIG. 4 is a schematic diagram illustrating the connection of the SoC 300 and the memory 400 based on the hybrid bonding technology according to an embodiment of the disclosure. The SoC 300 may be packaged in a die 610, and the memory 400 may be packaged in a die 620. The die 610 may be bonded to the die 620 through one or more through-silicon vias (TSVs) based on a hybrid bonding technique. In other words, the memory device 100 may include a three-dimensional stacked architecture.

Again in FIG. 3, the transistor 410 may include a terminal 411, a terminal 412, and a terminal 413. If the transistor 410 is a bipolar junction transistor (BJT), the terminal 411 may be the collector, the terminal 412 may be the base, and the terminal 413 may be the emitter. If the transistor 410 is a field-effect transistor (FET), the terminal 411 may be the drain, the terminal 412 may be the gate, and the terminal 413 may be the source. The terminal 411 may be coupled to the input/output terminal 303 of the SoC 300, the terminal 412 may be coupled to the command terminal 301 of the SoC 300, and the terminal 413 may be coupled to an inverse bit line BLB of the first sense amplifier 430.

The transistor 420 may include a terminal 421, a terminal 422, and a terminal 423. If the transistor 420 is a bipolar transistor, the terminal 421 may be the collector, the terminal 422 may be the base, and the terminal 423 may be the emitter. If the transistor 420 is a field-effect transistor, the terminal 421 may be the drain, the terminal 422 may be the gate and the terminal 423 may be the source. The terminal 421 may be coupled to the input/output terminal 304 of the SoC 300, the terminal 422 may be coupled to the command terminal 302 of the SoC 300, and the terminal 423 may be coupled to the bit line BL of the first sense amplifier 430. If the value of the bit line BL is 1, the value of the inverted bit line BLB is 0. If the value of the bit line BL is 0, the value of the inverted bit line BLB is 1.

The first sense amplifier 430 may include an inverter 431 and an inverter 432. The input terminal of the inverter 431 may be coupled to the output terminal of the inverter 432, and the output terminal of the inverter 431 may be coupled to the input terminal of the inverter 432. The output terminal of the inverter 431 may be coupled to the memory cell 440 through the bit line BL. The output terminal of the inverter 432 may be coupled to the memory cell 440 through the inverted bit line BLB. The first sense amplifier 430 may receive data from the memory cell 440. Specifically, the memory cell 440 may be coupled to the controller 450 through the word line WL. After the controller 450 enables the memory cell 440 through the word line WL, the data stored in the memory cell 440 may be transferred to the bit line BL or the inverted bit line BLB. The first sense amplifier 430 receives data from the memory cell 440 through the bit line BL or the inverted bit line BLB and stores the data. In other words, the controller 450 instructs the memory cell 440 to transfer data to the first sense amplifier 430 through the word line WL.

In one embodiment, the SoC 300 is coupled to the controller 450. When the SoC 300 is required to access the data in the memory cell 440, the SoC 300 issues a command to the controller 450 to instruct the controller 450 to enable the memory cell 440 through the word line WL. In one embodiment, the functions of controller 450 are implemented by the SoC 300. When the SoC 300 is required to access the data in the memory cell 440, the SoC 300 enables the memory cell 440 through the word line WL.

After the memory cell 440 transmits the data to the bit line BLB, the command terminal 301 of the SoC 300 issues an access command to the terminal 412 of the transistor 410 to conduct the terminal 411 and the terminal 413 of the transistor 410. Next, the input/output terminals 303 of the SoC 300 accesses the data on the inverted bit line BLB through the terminal 411 and the terminal 413. On the other hand, after the memory cell 440 transmits the data to the bit line BL, the command terminal 302 of the SoC 300 issues an access command to the terminal 422 of the transistor 420 to conduct the terminal 421 and the terminal 423 of the transistor 420. Then, the input/output terminal 304 of the SoC 300 accesses the data on the bit line BL through the terminal 421 and the terminal 423. In other words, the SoC 300 accesses the data output by the first sense amplifier 430 by issuing an access command.

When the memory 400 includes N (N is any positive integer) memory cells 440, the SoC 300 may be designed to include N input/output terminals (e.g., the input/output terminals 303 or the input/output terminal 304). The SoC 300 enables N transistors 410 (or N transistors 420) corresponding to the N memory cells 440 through a command terminal (for example, the command terminal 301 or the command terminal 302) to simultaneously access the data in the N memories in the memory cell 440. That is, the access rate or bandwidth of the memory 400 may increase as N increases. The access rate or bandwidth of the memory 400 will not be limited by the layout of the column select line CSL or the main data line MDQ. In one embodiment, the command terminal 301 (or the command terminal 302) of the SoC 300 is coupled to the N terminals 410 respectively corresponding to the N transistors 410 (or the N transistors 420). In this way, the SoC 300 may issue a single access command through the command terminal 301 (or the command terminal 302) to access the N memory cells 440, thereby reducing the number of commands between the SoC 300 and the memory 400.

Figure 5:
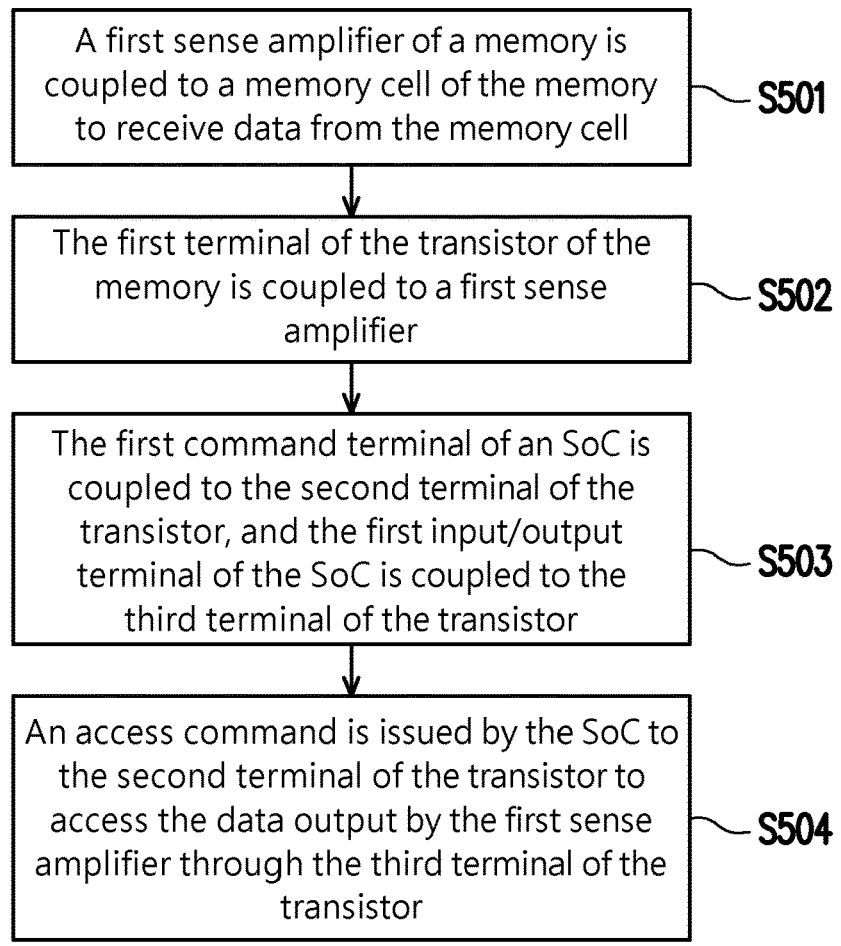
FIG. 5 is a flowchart of a method for accessing a memory according to an embodiment of the disclosure.

FIG. 5 is a flowchart of a method for accessing memory according to an embodiment of the disclosure. The method may be implemented by the memory device 100 shown in FIG. 3. In step S501, a first sense amplifier of the memory is coupled to a memory cell of the memory to receive data from the memory cell. In step S502, the first terminal of the transistor of the memory is coupled to the first sense amplifier. In step S503, the first command terminal of the SoC is coupled to the second terminal of the transistor, and the first input/output terminal of the SoC is coupled to the third terminal of the transistor. In step S504, an access command is issued by the SoC to the second terminal of the transistor to access the data output by the first sense amplifier through the third terminal of the transistor.

In summary, the SoC of the disclosure may be directly connected to the first sense amplifier of the memory in different dies through the hybrid bonding technique to access data. Compared with the conventional method that requires multiple row selections to read all the data in the memory, the memory of the disclosure is capable of transmitting the data in the first sense amplifier to the SoC directly without performing selection. Therefore, the disclosure may reduce the time required to perform row selection, thereby increasing the read/write bandwidth of the memory.

Although the embodiments of the disclosure has been described in detail, the disclosure is not limited to the embodiments, as various modifications and changes may be made within the scope of the disclosure described in the claims.

What is claimed is:

1. A memory device, comprising:
   a memory, comprising:
     a memory cell;
     a first sense amplifier, coupled to the memory cell and receiving data from the memory cell; and
     a transistor, having a first terminal coupled to the first sense amplifier; and
   a system on chip, comprising a first command terminal and a first input/output terminal, wherein the first command terminal is coupled to a second terminal of the transistor, and the first input/output terminal is coupled to a third terminal of the transistor, and
   the system on chip issues an access command to the second terminal of the transistor to access the data output by the first sense amplifier through the third terminal of the transistor.

2. The memory device of claim 1, wherein the first command terminal is coupled to a plurality of second terminals respectively corresponding to a plurality of transistors, the transistors comprise the transistor, and the second terminals comprise the second terminal.

3. The memory device of claim 1, wherein the system on chip is packaged in a first die, and the memory is packaged in a second die, wherein the first die is different from the second die.

4. The memory device of claim 3, wherein the first die is bonded to the second die by a through-silicon via based on a hybrid bonding technique.

5. The memory device of claim 1, wherein the transistor is a bipolar transistor, wherein the first terminal of the transistor is an emitter, the second terminal of the transistor is a base, and the third terminal of the transistor is a collector.

6. The memory device of claim 1, wherein the transistor is a field-effect transistor, wherein the first terminal of the transistor is a source, and the second terminal of the transistor is a gate, and the third terminal of the transistor is a drain.

7. The memory device of claim 1, wherein the memory is a static random-access memory.

8. The memory device of claim 1, wherein the memory is a dynamic random-access memory.

9. The memory device of claim 1, wherein the memory further comprises
   a controller, coupled to the memory cell through a word line, wherein the controller instructs the memory cell to transmit the data to the first sense amplifier through the word line.

10. A method for accessing a memory, applicable to a system on chip and the memory, the method comprising:
    coupling, by a first sense amplifier of the memory, to a memory cell of the memory to receive data from the memory cell;
    coupling a first terminal of a transistor of the memory to the first sense amplifier;
    coupling a first command terminal of the system on chip to a second terminal of the transistor, and coupling a first input/output terminal of the system on chip to a third terminal of the transistor; and
    issuing, by the system on chip, an access command to the second terminal of the transistor to access the data output by the first sense amplifier through the third terminal of the transistor.

* * * * *